United States Patent
Chung et al.

(10) Patent No.: US 10,056,439 B2
(45) Date of Patent: Aug. 21, 2018

(54) IMAGE CAPTURING APPARATUS

(71) Applicant: Gingy Technology Inc., Hsinchu (TW)

(72) Inventors: Chuck Chung, Hsinchu (TW);
Jen-Chieh Wu, Hsinchu (TW)

(73) Assignee: Gingy Technologies Inc., Hsinchu (TW)

( * ) Notice: Subject to any disclaimer, the term of this patent is extended or adjusted under 35 U.S.C. 154(b) by 0 days.

(21) Appl. No.: 15/896,083

(22) Filed: Feb. 14, 2018

(65) Prior Publication Data

US 2018/0175125 A1 Jun. 21, 2018

Related U.S. Application Data

(63) Continuation-in-part of application No. 15/239,842, filed on Aug. 18, 2016.
(Continued)

(30) Foreign Application Priority Data

Jul. 18, 2016 (TW) .............................. 105122567 A
Dec. 6, 2017 (CN) .......................... 2017 1 1273483

(51) Int. Cl.
*H01L 27/32* (2006.01)
*G06K 9/00* (2006.01)
(Continued)

(52) U.S. Cl.
CPC ...... *H01L 27/3234* (2013.01); *G06K 9/00006* (2013.01); *G06K 9/00892* (2013.01); *H04N 5/2251* (2013.01); *H01L 51/5237* (2013.01)

(58) Field of Classification Search
CPC ............. G06K 9/0004; G06K 9/00053; G06K 2009/0006; H01L 27/3234; G09G 3/3225
See application file for complete search history.

(56) References Cited

U.S. PATENT DOCUMENTS

| 5,177,802 A | 1/1993 | Fujimoto et al. |
| 2010/0134426 A1 * | 6/2010 | Lee ...................... G06F 3/0412 345/173 |

(Continued)

FOREIGN PATENT DOCUMENTS

| CN | 104849870 | 8/2015 |
| JP | 2003-141514 | 5/2003 |

(Continued)

OTHER PUBLICATIONS

"Office Action of Taiwan Counterpart Application", dated May 29, 2018, p. 1-p. 4.

*Primary Examiner* — Michael Pervan
(74) *Attorney, Agent, or Firm* — JCIPRNET (57) ABSTRACT

An image capturing apparatus including a sensor, an organic light emitting diode (OLED) display panel, and a collimator is provided. The OLED display panel is disposed on an image capturing side of the sensor. The collimator is disposed between the OLED display panel and the sensor. The collimator includes a plurality of collimating devices overlapped with each other. Each of the collimating devices includes a transparent substrate and a light absorbing layer disposed on the transparent substrate. The light absorbing layer includes a plurality of light passing openings, and the light passing openings expose sensing areas of the sensor.

18 Claims, 7 Drawing Sheets

Related U.S. Application Data

(60) Provisional application No. 62/266,002, filed on Dec. 11, 2015, provisional application No. 62/533,632, filed on Jul. 17, 2017.

(51) Int. Cl.
  *H04N 5/225* (2006.01)
  *H01L 51/52* (2006.01)

(56) References Cited

U.S. PATENT DOCUMENTS

| | | |
|---|---|---|
| 2011/0079704 A1 | 4/2011 | Yu et al. |
| 2012/0257031 A1* | 10/2012 | Tsuchiya .............. G06K 9/0004 348/77 |
| 2014/0218327 A1* | 8/2014 | Shi ........................ G06F 3/041 345/174 |
| 2016/0132712 A1 | 5/2016 | Yang et al. |
| 2016/0224816 A1 | 8/2016 | Smith et al. |
| 2017/0220844 A1 | 8/2017 | Jones et al. |
| 2017/0286742 A1 | 10/2017 | Mackey et al. |

FOREIGN PATENT DOCUMENTS

| | | |
|---|---|---|
| TW | 589467 | 6/2004 |
| TW | 201032146 | 9/2010 |
| TW | 201310299 | 3/2013 |
| TW | 201725938 | 7/2017 |

\* cited by examiner

IMAGE CAPTURING APPARATUS

CROSS-REFERENCE TO RELATED APPLICATION

This application is a continuation-in-part application of and claims the priority benefit of U.S. application Ser. No. 15/239,842, filed on Aug. 18, 2016, now pending, which claims the priority benefits of U.S. provisional application Ser. No. 62/266,002, filed on Dec. 11, 2015, and Taiwan application serial no. 105122567, filed on Jul. 18, 2016. This application also claims the priority benefits of U.S. provisional application Ser. No. 62/533,632, filed on Jul. 17, 2017, and China application serial no. 201711273483.2, filed on Dec. 6, 2017. The entirety of each of the above-mentioned patent applications is hereby incorporated by reference herein and made a part of this specification.

BACKGROUND

1. Technical Field

The disclosure relates to a photoelectric apparatus. More particularly, the disclosure relates to an image capturing apparatus.

2. Description of Related Art

Types of biometric identification include identification of face, voice, iris, retina, vein pattern, palm print, fingerprint, etc. According to different ways of sensing, biometric identification apparatuses may be categorized into optical, capacitive, ultrasonic, and thermal biometric identification apparatuses. In general, an optical biometric identification apparatus includes a light source, a light guide device, and a sensor. A light beam emitted by the light source illuminates a to-be-identified object that is pressed on the light guide device. The sensor receives the light beam reflected by the to-be-identified object, so as to proceed with biometric identification. During an image capturing process of the sensor, the light beam reflected by the fingerprint is easily scattered while the light beam is being transmitted to the sensor, resulting in poor image quality and affecting the identification result. Although the related art has already addressed improvements in the quality of the captured image, said technical improvements cannot effectively resolve a crosstalk problem.

SUMMARY

The disclosure provides an image capturing apparatus having good identification ability.

The image capturing apparatus provided in an exemplary embodiment of the invention includes a sensor, an organic light emitting diode (OLED) display panel, and a collimator. The OLED display panel is disposed on an image capturing side of the sensor. The collimator is disposed between the OLED display panel and the sensor. The collimator includes a plurality of collimating devices overlapped with each other. Each of the plurality of collimating devices includes a transparent substrate and a light absorbing layer disposed on the transparent substrate. The light absorbing layer includes a plurality of light passing openings, and the plurality of light passing openings exposes a plurality of sensing areas of the sensor.

In an exemplary embodiment of the invention, a distance between the plurality of light passing openings is S. A width of each of the plurality of light passing openings is W, and W<S. A transparent substrate thickness of a first collimating device of the plurality of collimating devices is T1. A transparent substrate thickness of a second collimating device of the plurality of collimating devices is T2. The image capturing apparatus satisfies:

$$0.3 \times \frac{W}{S} \times T1 \leq T2 \leq T1.$$

In an exemplary embodiment of the invention, the image capturing apparatus satisfies:

$$0.3 \times \frac{W}{S} \times T1 \leq T2 \leq 0.9 \times \frac{W}{S} \times T1.$$

In an exemplary embodiment of the invention, the image capturing apparatus satisfies:

$$0.9 \times \frac{W}{S} \times T1 \leq T2 \leq T1.$$

Based on the above, in the image capturing apparatus provided in one or more exemplary embodiments of the invention, the plurality of light absorbing layers among the plurality of stacked collimating devices absorbs scattered light beams between the plurality of light absorbing layers, thereby effectively resolving a crosstalk problem. As such, the image capturing apparatus has good identification ability.

To make the above features of the disclosure more comprehensible, several exemplary embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles described herein.

DESCRIPTION OF THE EXEMPLARY EMBODIMENTS

In the following detailed description of the exemplary embodiments, reference is made to the accompanying drawings which form a part hereof, and in which are shown by way of illustrating specific exemplary embodiments in which the invention may be practiced. In this regard, directional terminology, such as "top," "bottom," "front," "back,"

"left," "right," etc., is used with reference to the orientation of the Figure(s) being described. The components of the invention can be positioned in a number of different orientations. As such, the directional terminology is used for purposes of illustration and is in no way limiting. Also, identical or similar devices are given identical or similar reference numerals in any of the following exemplary embodiments.

In the following exemplary embodiments of the invention, an image capturing apparatus is adapted to capture biometrics of an object under test. For example, the object under test may be a finger. Correspondingly, the biometrics may be a fingerprint or a vein pattern, but the invention is not limited thereto. In an exemplary embodiment, the object under test may be a palm, and the biometrics may be palm print.

Figure 1A:
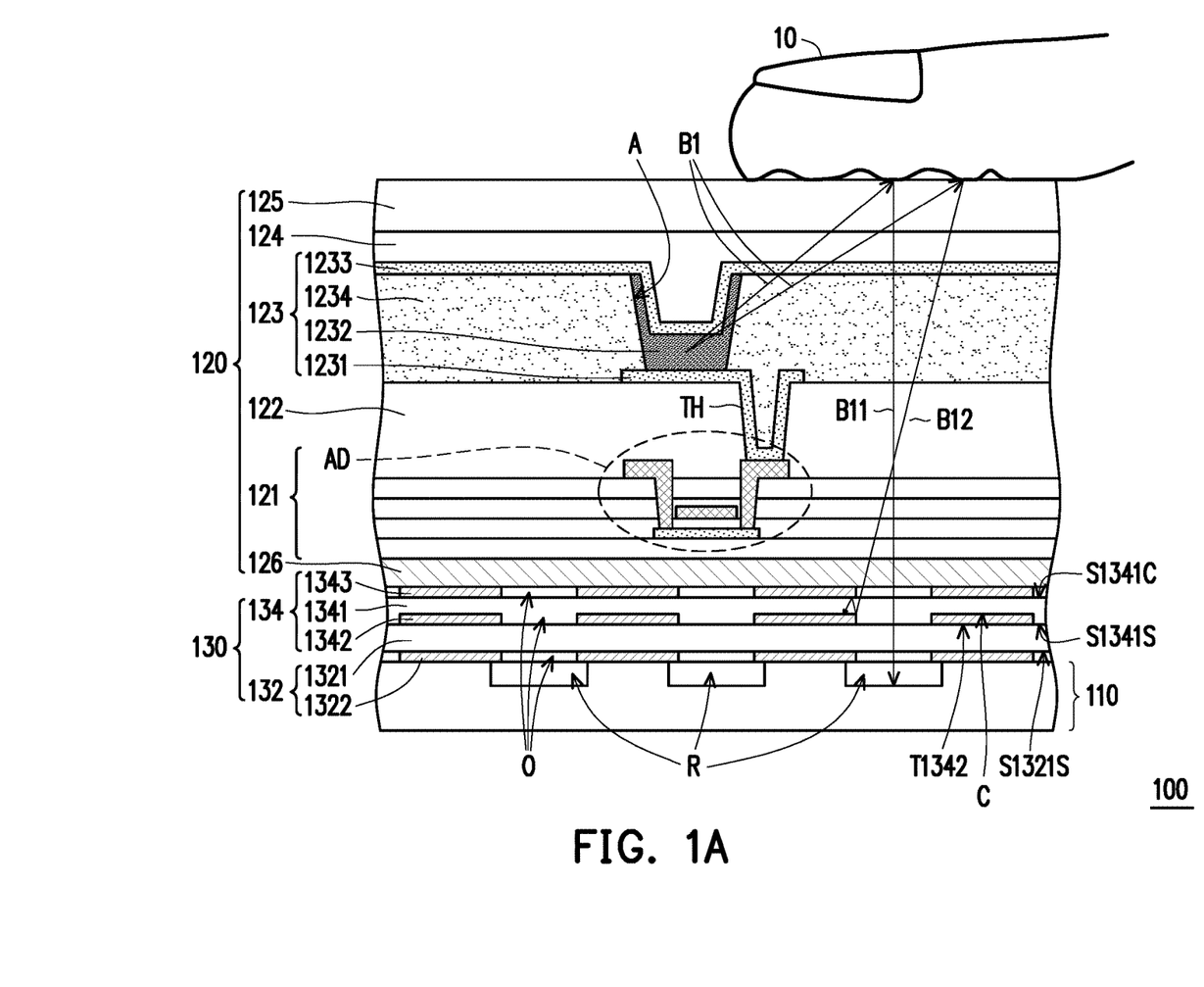
FIG. 1A is a schematic cross-sectional view of a portion of an image capturing apparatus according to a first exemplary embodiment of the invention.
Figure 1B:
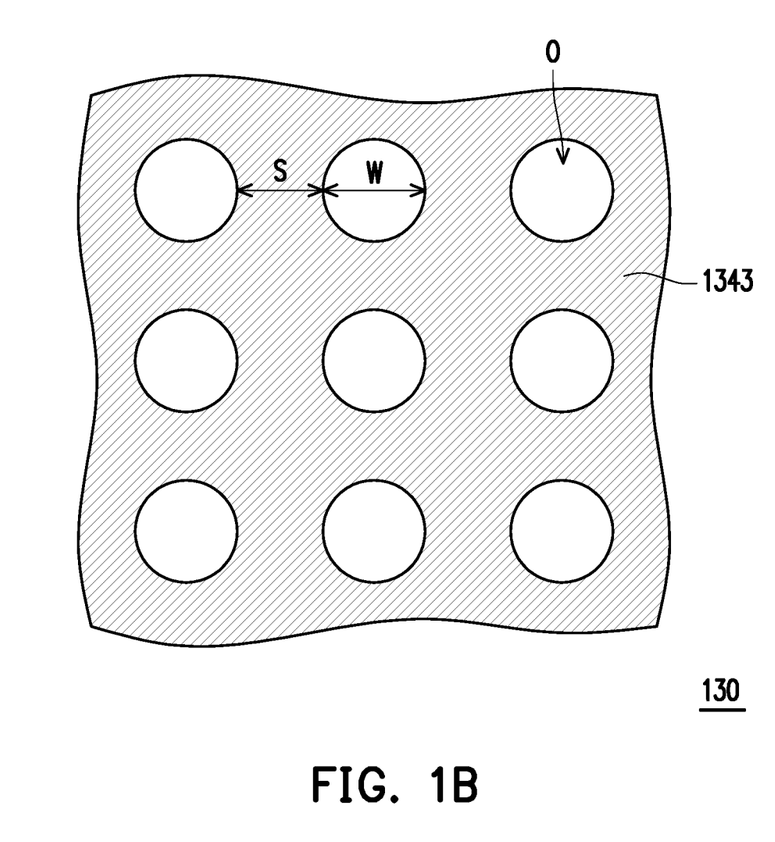
FIG. 1B is a schematic top view of a portion of the collimator shown in FIG. 1A.
Figure 1C:
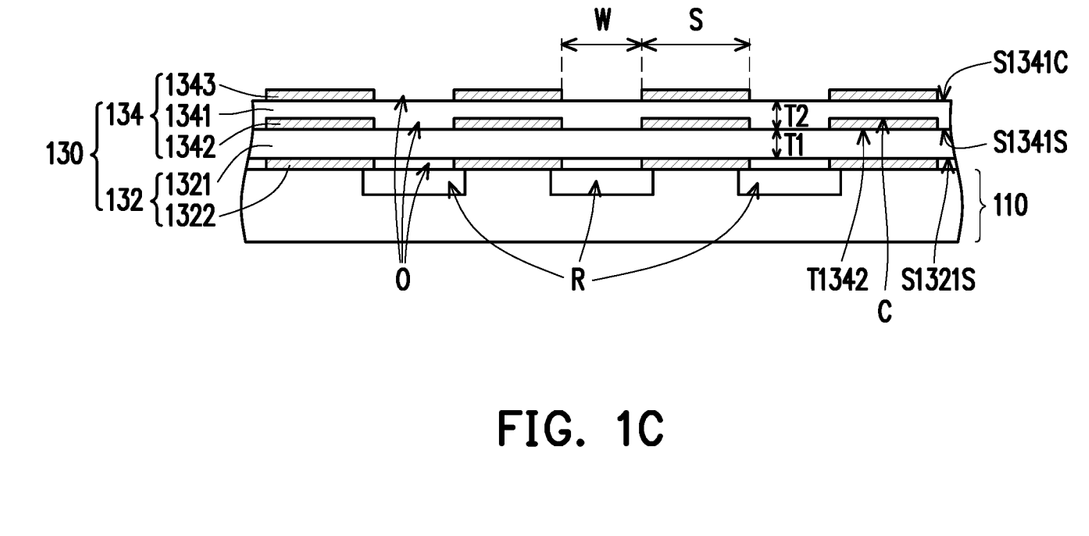
FIG. 1C is a schematic enlarged view of the collimator and the sensor shown in FIG. 1A.

FIG. 1A is a schematic cross-sectional view of a portion of an image capturing apparatus according to a first exemplary embodiment of the invention. FIG. 1B is a schematic top view of a portion of the collimator shown in FIG. 1A. FIG. 1C is a schematic enlarged view of the collimator and the sensor shown in FIG. 1A.

Referring to FIG. 1A, an image capturing apparatus 100 provided in the first exemplary embodiment of the invention includes a sensor 110, an organic light emitting diode (OLED) display panel 120, and a collimator 130, wherein the OLED display panel 120 is disposed on an image capturing side of the sensor 110, and the collimator 130 is disposed between the OLED display panel 120 and the sensor 110. In other words, the collimator 130 and the OLED display panel 120 are sequentially stacked on the image capturing side of the sensor 110 in a direction of an object 10 under test.

The collimator 130 and the OLED display panel 120 may be joined together by an adhesive layer (not shown) or a fixing mechanism (not shown), and so may be the collimator 130 and the sensor 110. The adhesive layer may be an optical clear adhesive (OCA), but the invention is not limited thereto.

Furthermore, the sensor 110 may include charge coupled devices (CCDs), a complementary metal-oxide semiconductor (CMOS), or image sensing devices of other suitable types configured to receive a light beam reflected by the object 10 under test (e.g., a light beam containing fingerprint pattern information). Locations of the CCDs or a plurality of pixel areas of the CMOS are a plurality of sensing areas R of the sensor 110 configured to receive the light beam.

The OLED display panel 120 may be an active OLED display panel or a passive OLED display panel. FIG. 1A shows an exemplary embodiment of the active OLED display panel. However, the exemplary embodiments of the OLED display panel 120 are not limited thereto. In addition, FIG. 1A schematically shows one pixel area of the active OLED display panel. Practically, the active OLED display panel may include a plurality of pixel areas arranged in an array for planar display.

Referring to FIG. 1A, the OLED display panel 120 may include an active device array layer 121, a planarization layer 122, a display device array layer 123, a passivation layer 124, a cover plate 125, and a reflective layer 126.

The active device array layer 121 includes an active device AD. The active device AD may be a known-type active device, and the type of the active device AD is not limited thereto. The planarization layer 122 is disposed on the active device array layer 121 and includes a through hole TH. The through hole TH exposes a portion of the active device array layer 121 (e.g., exposing a partial area of a drain of the active device AD). The display device array layer 123 includes an anode 1231, a light emitting layer 1232, and a cathode 1233. The anode 1231 is disposed on the planarization layer 122 and extends into the through hole TH to contact the portion of the active device array layer 121 exposed by the through hole TH, so that the anode 1231 is electrically connected to the drain of the active device AD. The light emitting layer 1232 is disposed on the anode 1231, and the light emitting layer 1232 may not overlap the through hole TH. The cathode 1233 is disposed on the light emitting layer 1232.

Depending on different needs, the display device array layer 123 may further include a barrier layer 1234. The barrier layer 1234 is disposed on the planarization layer 122 and covers the anode 1231. In addition, the barrier layer 1234 has a receiving opening A. The receiving opening A exposes a partial area of the anode 1231 (e.g., exposing a partial area of the anode 1231 located on the planarization layer 122), and the light emitting layer 1232 is disposed in the receiving opening A. The cathode 1233 is disposed on the bather layer 1234 and covers the light emitting layer 1232 located in the receiving opening A.

The passivation layer 124 is disposed on the cathode 1233. The cover plate 125 is disposed on the passivation layer 124. The reflective layer 126 is disposed between the active device array layer 121 and the collimator 130. The reflective layer 126 has high reflectivity, so that most of the light beam from the light emitting layer 1232 may be emitted out of the cover plate 125, thereby improving a utilization rate of the light beam. The reflective layer 126 provided in the exemplary embodiment is a continuous film. The light beam transmitted towards the sensor 110 needs to pass through the reflective layer 126 and can then be received by the sensor 110. Therefore, the reflective layer 126 should be able to allow the light beam containing biometric information to pass through. In the exemplary embodiment, the light beam provided by the light emitting layer 1232 is used not only for display but also for biometric identification. Specifically, a portion of the light beam (e.g., a light beam B1) provided by the light emitting layer 1232 illuminates the object 10 under test. A portion of the light beam B1 reflected by the object 10 under test (the light beam containing fingerprint pattern information and including a light beam B11 and a light beam B12) is transmitted towards the sensor 110. Therefore, the reflective layer 126 should be able to allow a visible light to pass through, so as to facilitate the subsequent biometric identification. For example, the reflective layer 126 has a transmittance falling within a range from 0.1% to 10% in a visible spectrum (at the wavelengths between 400 nm and 700 nm). The image capturing apparatus 100 provided in an exemplary embodiment may further include a non-visible light source (not shown) to proceed with biometric identification. The non-visible light source may be an infrared light source, but the invention is not limited thereto. Under this configuration, the transmittance of the reflective layer 126 in an infrared light spectrum falls within the range from 0.1% to 10%.

The collimator 130 is adapted to collimate the light beam transmitted towards the sensor 110. Specifically, the collimator 130 includes a plurality of collimating devices overlapped with each other. The collimator 130 provided in the exemplary embodiment includes a first collimating device 132 and a second collimating device 134, and the first collimating device 132 is disposed between the second collimating device 134 and the sensor 110. However, the number of collimating devices of the collimator 130 and the configuration relationship of the collimating devices may be changed according to actual needs and are not limited to what is shown in FIG. 1A.

Each of the collimating devices includes a transparent substrate and a light absorbing layer disposed on the transparent substrate. For example, the first collimating device 132 includes a transparent substrate 1321 and a light absorbing layer 1322, wherein the light absorbing layer 1322 is disposed on a surface S1321S of the transparent substrate 1321 facing the sensor 110 and is located between the transparent substrate 1321 and the sensor 110. The second collimating device 134 includes a transparent substrate 1341, a light absorbing layer 1342, and a light absorbing layer 1343, wherein the light absorbing layer 1342 is disposed on a surface S1341S of the transparent substrate 1341 facing the sensor 110 and is located between the transparent substrate 1341 and the transparent substrate 1321, while the light absorbing layer 1343 is disposed on a surface S1341C of the transparent substrate 1341 facing the cover plate 125 and is located between the cover plate 125 and the transparent substrate 1341.

The number of transparent substrate and the number of light absorbing layer of each of the collimating devices, the relative configuration relationship between the transparent substrate and the light absorbing layer, and a method of forming the light absorbing layer may be changed according to actual needs and are not limited to what is shown in FIG. 1A. In the exemplary embodiment, a plurality of recesses C are formed on the surface S1341S of the transparent substrate 1341, and the light absorbing layer 1342 is disposed in the recesses C of the transparent substrate 1341, so that an outer surface T1342 of the light absorbing layer 1342 is leveled with a portion of the surface S1341S where no recess C is formed. The method of forming the light absorbing layer 1342 may include following steps. First, the recesses C are formed on the surface S1341S of the transparent substrate 1341. Next, a light absorbing material is formed in the recesses C. The light absorbing material is then solidified to form the light absorbing layer 1342. In an exemplary embodiment, the transparent substrate 1341 and the recesses C may be formed via molding, and the step of forming the recesses C may be omitted.

In each of the collimating devices, the transparent substrate (e.g., the transparent substrate 1321 and the transparent substrate 1341) provides a supporting surface for the light absorbing layer (e.g., the light absorbing later 1322, the light absorbing later 1342, and the light absorbing layer 1343). The transparent substrate may be a glass substrate, a plastic substrate, or transparent photoresist. The light absorbing layer is configured to absorb a large-angle light beam (e.g., the light beam B12) of the portion of the light beam B1 reflected by the object 10 under test to achieve an effect of collimating the light beam. The light absorbing layer has a high absorption rate and low reflectivity, so that a proportion of the light beam transmitted to the light absorbing layer and reflected by the light absorbing layer is reduced, and the number of times of reflections of the light beam by the light absorbing layer is reduced, thereby effectively reducing a proportion of the large-angle light beam received by the sensor 110. Low reflectivity means that the reflectivity is below 10% in visible light wave bands and infrared light wave bands. For example, the light absorbing layer may be ink having the low reflectivity, but the invention is not limited thereto.

In addition, the light absorbing layer includes a plurality of light passing openings O, so that the portion of the light beam B1 reflected by the object 10 under test (e.g., the light beam B11) may be received by the sensor 110. The light passing openings O expose the sensing areas R of the sensor 110. Specifically, the light passing openings O of the light absorbing layers 1322, 1342, and 1343 are disposed correspondingly to the sensing areas R of the sensor 110.

With the design of the light absorbing layers in the stacked collimating devices, the large-angle light beam (e.g., the light beam B12) is absorbed by the light absorbing layers due to multiple reflections within the light absorbing layers, so that a crosstalk problem may be effectively resolved, and the image capturing apparatus 100 may have good identification ability.

In an exemplary embodiment, an effective light passing opening corresponding to each of the sensing areas R (i.e., an intersection area of the light passing openings O of the light absorbing layers 1322, 1342, and 1343) may be reduced due to the misalignment design of the light passing openings O (i.e., the light passing openings O of the light absorbing layers are not completely aligned with one another), so as to further improve the effect of collimating the light beam.

In another exemplary embodiment as shown in FIG. 1B and FIG. 1C, the identification ability of the image capturing apparatus 100 may be further improved by controlling a distance S between the light passing openings O, a width W of the light passing openings O, a transparent substrate thickness T1 of the first collimating device 132, and a transparent substrate thickness T2 of the second collimating device 134. Specifically, the image capturing apparatus 100 satisfies:

$$0.3 \times \frac{W}{S} \times T1 \le T2 \le T1,$$

so as to have good identification ability. In another exemplary embodiment, if the image capturing apparatus 100 satisfies:

$$0.3 \times \frac{W}{S} \times T1 \le T2 \le 0.9 \times \frac{W}{S} \times T1,$$

the proportion of the large-angle beam received by the sensor 110 may be further reduced, thereby effectively improving a signal-to-noise ratio and helping back-end identification of signals and noise. Further, the rate of successful identification may increase. In another exemplary embodiment, the image capturing apparatus 100 satisfies:

$$0.9 \times \frac{W}{S} \times T1 \le T2 \le T1,$$

wherein the signal-to-noise ratio is close to 0. Here, the transparent substrate thickness of the collimating device refers to a sum of the thicknesses of all the transparent substrates in the collimating device. In the exemplary embodiment, the first collimating device 132 only includes one transparent substrate (i.e., the transparent substrate 1321), and the second collimating device 134 only includes one transparent substrate (i.e., the transparent substrate 1341). Therefore, the transparent substrate thickness T1 of the first collimating device 132 is the thickness of the transparent substrate 1321, and the transparent substrate thickness T2 of the second collimating device 134 is the thickness of the transparent substrate 1341. Although FIG. 1B shows that the shape of the light passing openings O is a circular shape and the width W of the light passing openings O is a diameter of the light passing openings O, the invention is not limited thereto. In another exemplary embodiment, the shape of the light passing openings O may be a quadrangle or other polygons, and the width W of the light passing openings O is defined as a side length of the quadrangle or of other polygons.

FIG. 2 to FIG. 5 are respectively schematic cross-sectional views of image capturing apparatuses according to a second exemplary embodiment to a fifth exemplary embodiment of the invention, wherein identical components are denoted by identical reference numerals, descriptions of which are not repeated below.

Figure 2:
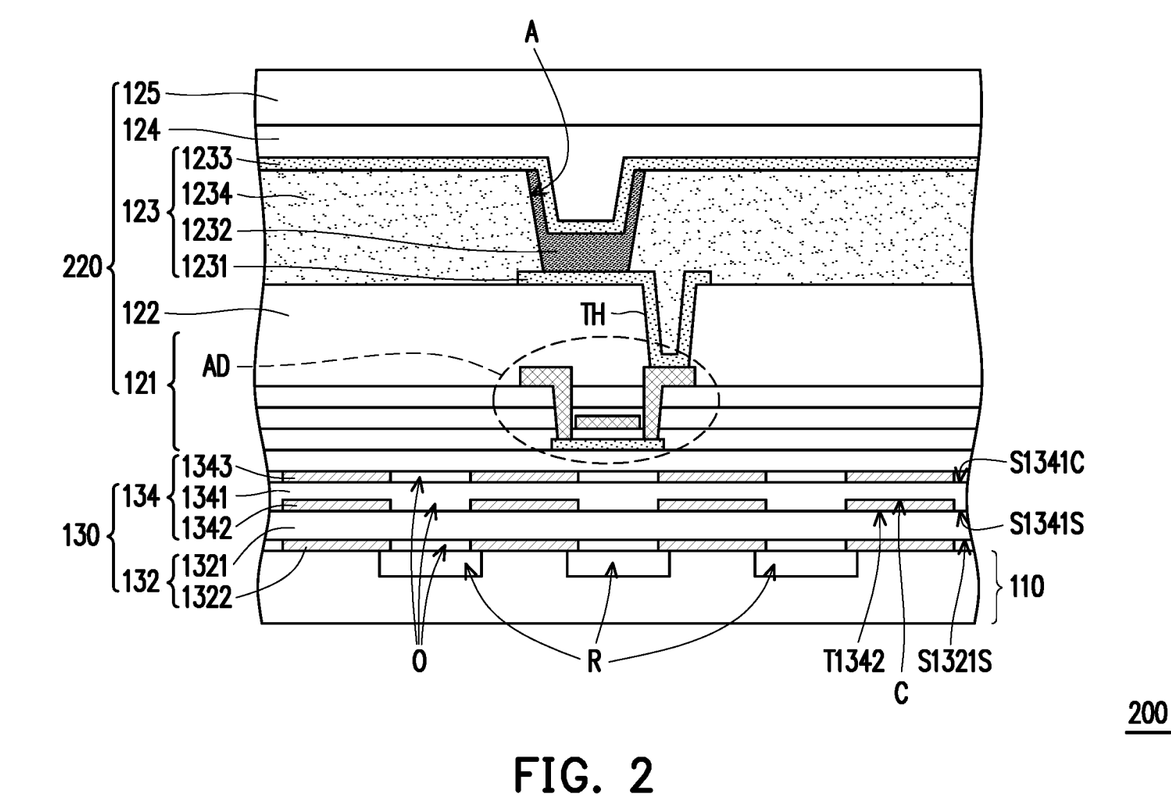
FIG. 2 to FIG. 5 are respectively schematic cross-sectional views of image capturing apparatuses according to a second exemplary embodiment to a fifth exemplary embodiment of the invention.

Referring to FIG. 2, main differences between an image capturing apparatus 200 provided in the second exemplary embodiment of the invention and the image capturing apparatus 100 shown in FIG. 1 are as follows. In the image capturing apparatus 200, an OLED display panel 220 does not include the reflective layer 126 shown in FIG. 1A, so as to increase an amount of light guided into the sensing areas R of the sensor 110.

In the exemplary embodiment, the portion of the light beam provided by the light emitting layer 1232 is used for biometric identification. However, the image capturing apparatus 200 provided in an exemplary embodiment may further include the non-visible light source (not shown) to proceed with biometric identification. The non-visible light source may be the infrared light source, but the invention is not limited thereto. In addition, the identification ability of the image capturing apparatus 200 may be further improved due to the misalignment design of the light passing openings O or by controlling the distance between the light passing openings O, the width of the light passing openings O, the transparent substrate thickness of the first collimating device 132, and the transparent substrate thickness of the second collimating device 134.

Figure 3:
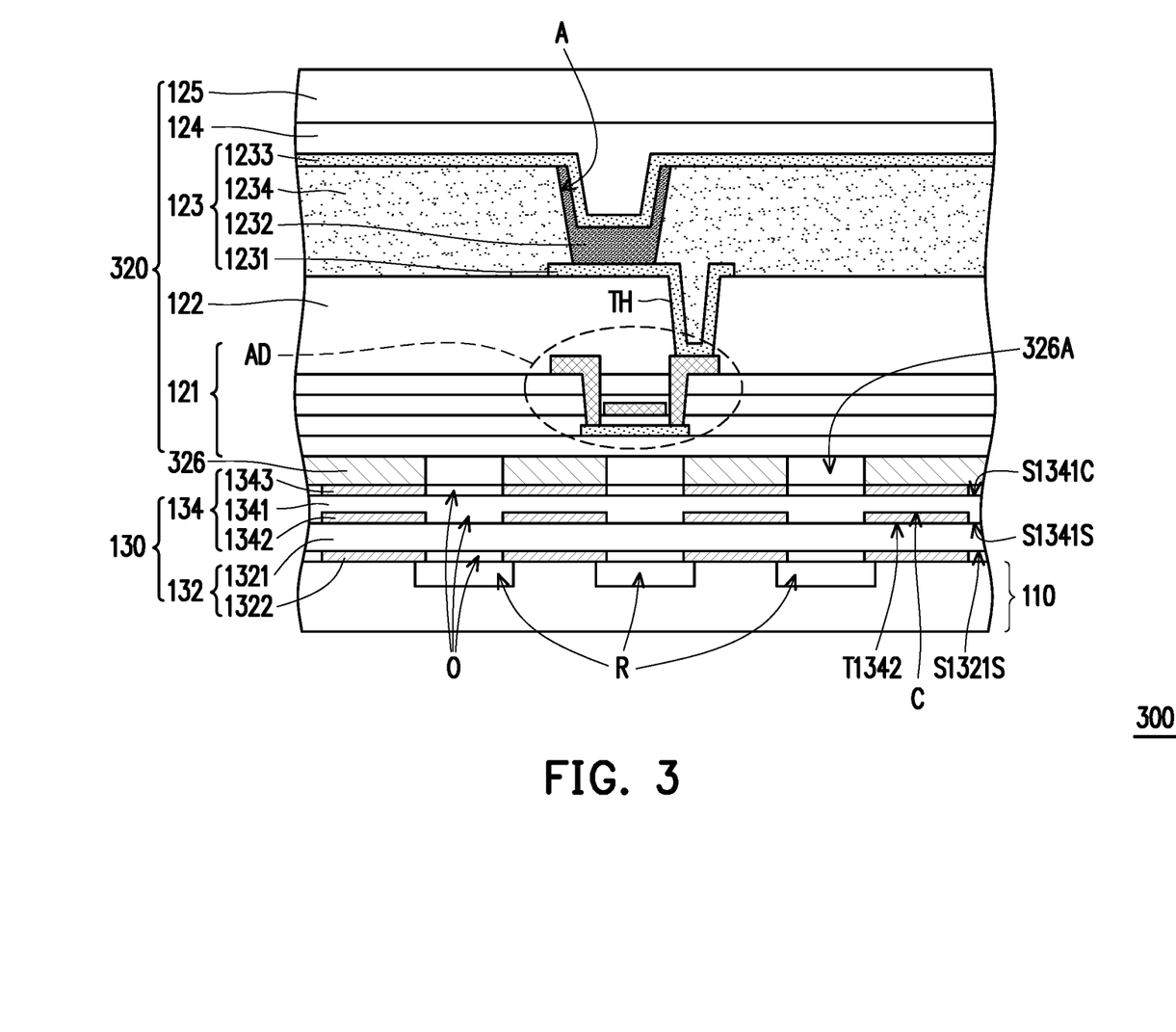

Referring to FIG. 3, main differences between an image capturing apparatus 300 provided in the third exemplary embodiment of the invention and the image capturing apparatus 100 shown in FIG. 1 are as follows. In the image capturing apparatus 300, a reflective layer 326 of an OLED display panel 320 includes a plurality of holes 326A. The holes 326A expose the sensing areas R of the sensor 110, thereby increasing the amount of light guided into the sensing areas R of the sensor 110.

In the exemplary embodiment, the portion of the light beam provided by the light emitting layer 1232 is used for biometric identification. However, the image capturing apparatus 300 provided in an exemplary embodiment may further include the non-visible light source (not shown) to proceed with biometric identification. The non-visible light source may be the infrared light source, but the invention is not limited thereto. In addition, the identification ability of the image capturing apparatus 300 may be further improved due to the misalignment design of the light passing openings O or by controlling the distance between the light passing openings O, the width of the light passing openings O, the transparent substrate thickness of the first collimating device 132, and the transparent substrate thickness of the second collimating device 134.

Figure 4:
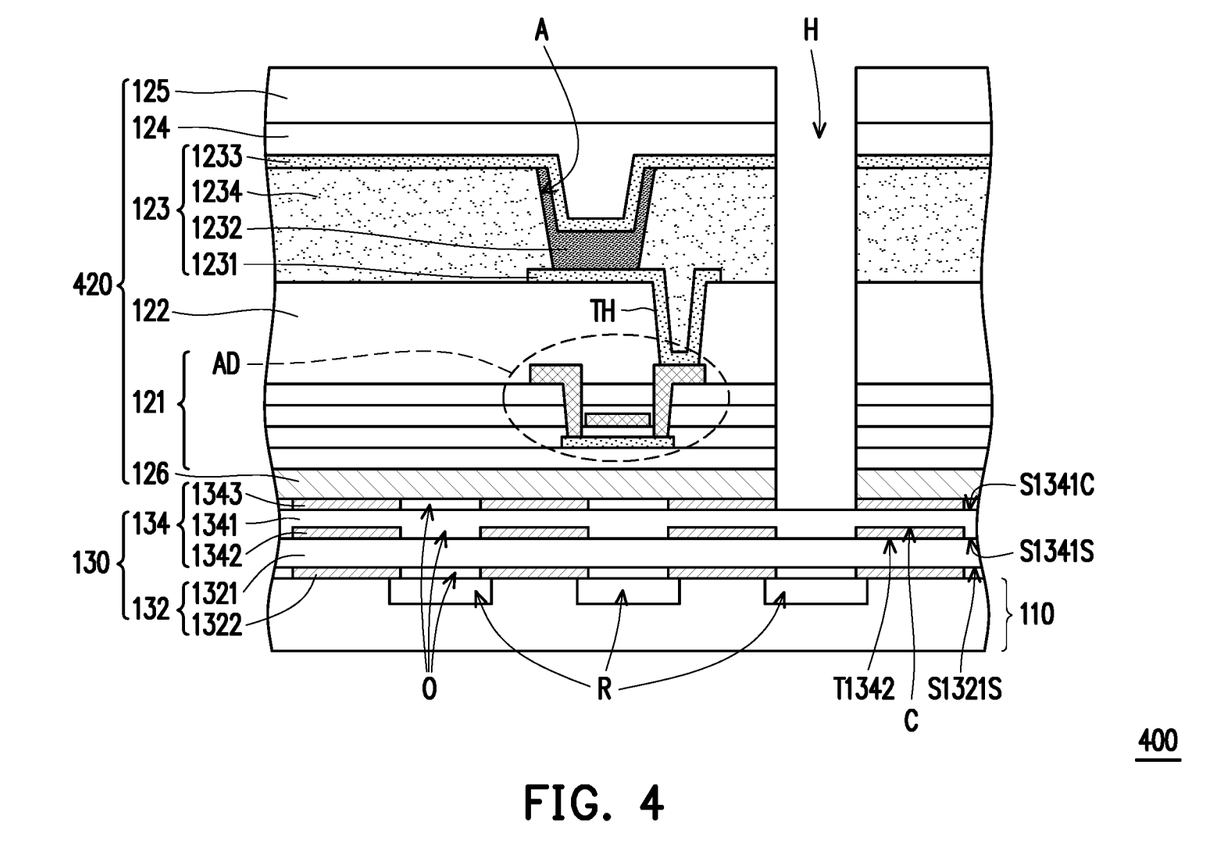

Referring to FIG. 4, main differences between an image capturing apparatus 400 provided in the fourth exemplary embodiment of the invention and the image capturing apparatus 100 shown in FIG. 1 are as follows. In the image capturing apparatus 400, an OLED display panel 420 includes a plurality of drill holes H. The drill holes H are respectively located in the pixel areas of the OLED display panel 420 (FIG. 4 only schematically shows one drill hole H in one pixel area). The drill holes H respectively penetrate the passivation layer 124, the display device array layer 123, the planarization layer 122, the active device array layer 121, and the reflective layer 126 to expose the sensing areas R of the sensor 110 (The drill hole H in each of the pixel areas exposes one corresponding sensing area R). In another exemplary embodiment of the invention, the drill holes H may also simultaneously penetrate the cover plate 125, the passivation layer 124, the display device array layer 123, the planarization layer 122, the active device array layer 121, and the reflective layer 126 to expose the sensing areas R of the sensor 110 (The drill hole H in each of the pixel areas exposes one corresponding sensing area R).

In the exemplary embodiment, the portion of the light beam provided by the light emitting layer 1232 is used for biometric identification. However, the image capturing apparatus 400 provided in an exemplary embodiment may further include the non-visible light source (not shown) to proceed with biometric identification. The non-visible light source may be the infrared light source, but the invention is not limited thereto. In addition, the identification ability of the image capturing apparatus 400 may be further improved due to the misalignment design of the light passing openings O or by controlling the distance between the light passing openings O, the width of the light passing openings O, the transparent substrate thickness of the first collimating device 132, and the transparent substrate thickness of the second collimating device 134.

Figure 5:
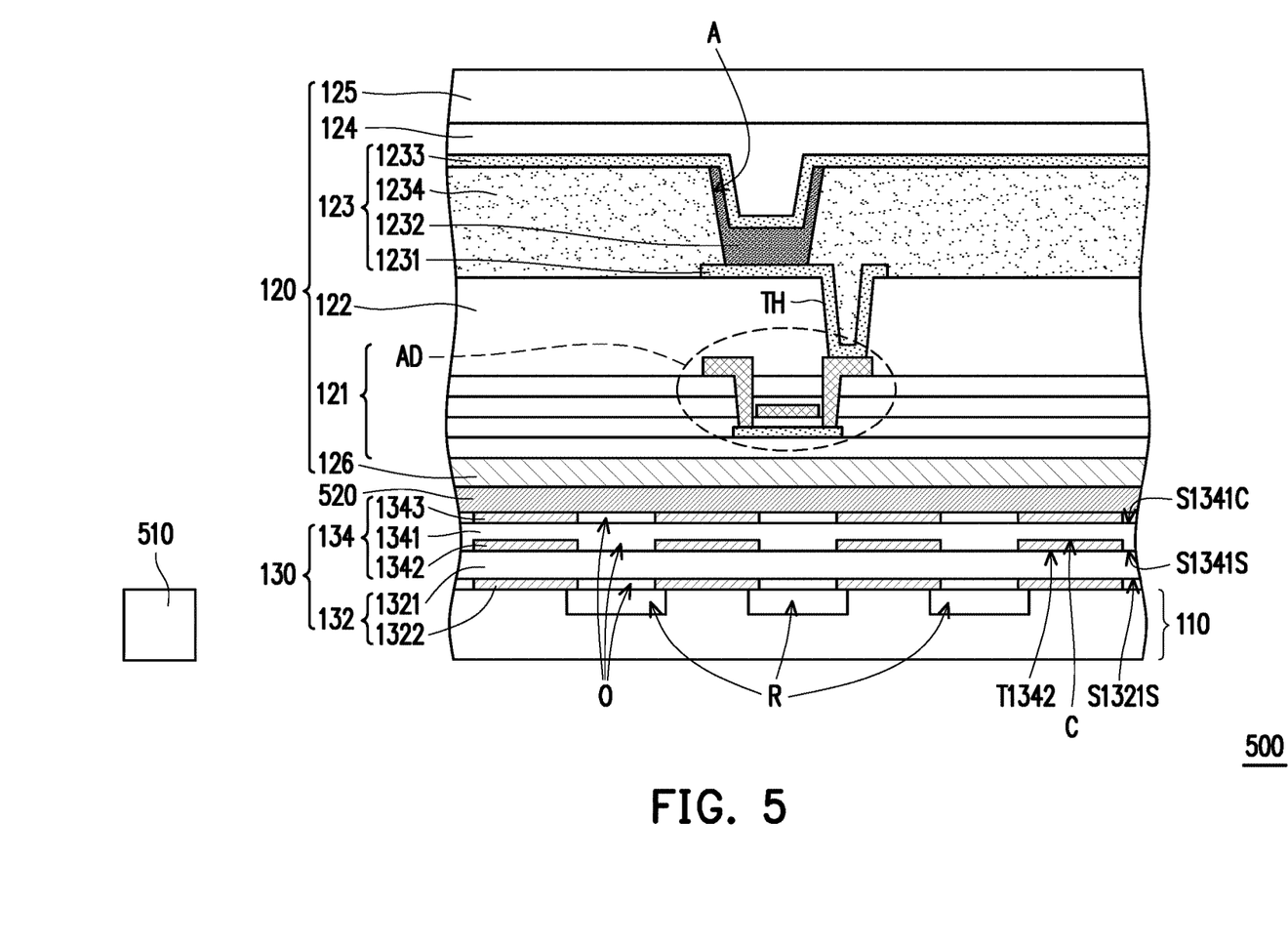

Referring to FIG. 5, main differences between an image capturing apparatus 500 provided in the fifth exemplary embodiment of the invention and the image capturing apparatus 100 shown in FIG. 1 are as follows. The image capturing apparatus 500 further includes a light source 510 and a bandpass filter layer 520. The bandpass filter layer 520 is disposed between the OLED display panel 120 and the sensor 110, wherein a light spectrum of the light source 510 falls within a transmission spectrum of the bandpass filter layer 520.

Specifically, the light spectrum of the light source 510 may be the non-visible light source, so that a non-visible light beam provided by the light source 510 may be distinguished from the visible light beam provided by the light emitting layer 1232. The light source 510 may be the infrared light source, but the invention is not limited thereto.

The bandpass filter layer 520 may be disposed between the OLED display panel 120 and the collimator 130 or disposed between the collimator 130 and the sensor 110. The bandpass filter layer 520 is adapted to allow the light beam from the light source 510 to pass through and to filter other light beams, so as to avoid an interference caused by an ambient light beam or by the light beam from the light emitting layer 1232 transmitted to the sensor 110, thereby improving the identification ability of the image capturing apparatus 500. For example, the bandpass filter layer 520 may be an infrared bandpass filter layer that allows a light beam having a wavelength of 800 nm to 900 nm to pass through and filters a light beam having a wavelength of other than 800 nm to 900 nm. Correspondingly, the light source 510 is the infrared light source with a wavelength falling in the range from 800 nm to 900 nm. In other exemplary embodiments, the bandpass filter layer 520 may allow a light beam having a wavelength of 840 nm to 860 nm or a light beam having a wavelength of 890 nm to 990 nm to pass through, and the light source 510 is the infrared light source with a wavelength falling in the range from 840 nm to 860 nm or from 890 nm to 990 nm, but the invention is not limited thereto.

In an exemplary embodiment, the identification ability of the image capturing apparatus 500 may be further improved due to the misalignment design of the light passing openings O or by controlling the distance between the light passing openings O, the width of the light passing openings O, the transparent substrate thickness of the first collimating device 132, and the transparent substrate thickness of the second collimating device 134.

To sum up, in the image capturing apparatus provided in one or more exemplary embodiments of the invention, the light absorbing layers among the stacked collimating devices absorb scattered light beams between the light absorbing layers, thereby effectively resolving the crosstalk problem, so that the image capturing apparatus has good identification ability. In an exemplary embodiment, the identification ability of the image capturing apparatus may be further improved due to the misalignment design of the light passing openings or by controlling the distance between the light passing openings, the width of the light passing openings, and the transparent substrate thicknesses of the different collimating devices. In addition, the image capturing apparatus may further include the non-visible light source and the bandpass filter layer to further improve the identification ability of the image capturing apparatus.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. An image capturing apparatus, comprising:
   a sensor;
   an organic light emitting diode display panel, disposed on an image capturing side of the sensor; and
   a collimator, disposed between the organic light emitting diode display panel and the sensor, the collimator comprising a plurality of collimating devices overlapped with each other, wherein each of the plurality of collimating devices comprises a transparent substrate and a light absorbing layer disposed on the transparent substrate, the light absorbing layer comprises a plurality of light passing openings, and the plurality of light passing openings exposes a plurality of sensing areas of the sensor,
   wherein the organic light emitting diode display panel comprises an active device array layer, a planarization layer, a display device array layer, a passivation layer, and a cover plate, the planarization layer is disposed on the active device array layer and comprises a through hole, the through hole exposes a portion of the active device array layer, the display device array layer comprises an anode, a light emitting layer, and a cathode, the anode is disposed on the planarization layer and extends into the through hole to contact the portion of the active device array layer, the light emitting layer is disposed on the anode, the cathode is disposed on the light emitting layer, the passivation layer is disposed on the cathode, and the cover plate is disposed on the passivation layer,
   wherein the organic light emitting diode display panel comprises a reflective layer disposed between the active device array layer and the collimator, and
   wherein the reflective layer comprises a plurality of holes exposing the plurality of sensing areas of the sensor.

2. The image capturing apparatus of claim 1, wherein the organic light emitting diode display panel comprises a plurality of drill holes respectively penetrating the passivation layer, the display device array layer, the planarization layer, the active device array layer, and the reflective layer to expose the plurality of sensing areas of the sensor.

3. The image capturing apparatus of claim 2, wherein a distance between the plurality of light passing openings is S, a width of each of the plurality of light passing openings is W, W<S, a transparent substrate thickness of a first collimating device of the plurality of collimating devices is T1, a transparent substrate thickness of a second collimating device of the plurality of collimating devices is T2, and the image capturing apparatus satisfies:

$$0.3 \times \frac{W}{S} \times T1 \leq T2 \leq T1.$$

4. The image capturing apparatus of claim 3, wherein the image capturing apparatus satisfies:

$$0.3 \times \frac{W}{S} \times T1 \leq T2 \leq 0.9 \times \frac{W}{S} \times T1.$$

5. The image capturing apparatus of claim 4, further comprising:
   a light source; and
   a bandpass filter layer, disposed between the organic light emitting diode display panel and the sensor, wherein a light spectrum of the light source falls within a transmission spectrum of the bandpass filter layer.

6. The image capturing apparatus of claim 3, wherein the image capturing apparatus satisfies:

$$0.9 \times \frac{W}{S} \times T1 \leq T2 \leq T1.$$

7. The image capturing apparatus of claim 1, wherein a plurality of recesses are formed on a surface of the transparent substrate, and the light absorbing layer is disposed in the plurality of recesses of the transparent substrate.

8. The image capturing apparatus of claim 7, wherein a distance between the plurality of light passing openings is S, a width of each of the plurality of light passing openings is W, W<S, a transparent substrate thickness of a first collimating device of the plurality of collimating devices is T1, a transparent substrate thickness of a second collimating device of the plurality of collimating devices is T2, and the image capturing apparatus satisfies:

$$0.3 \times \frac{W}{S} \times T1 \leq T2 \leq T1.$$

9. The image capturing apparatus of claim 8, wherein the image capturing apparatus satisfies:

$$0.3 \times \frac{W}{S} \times T1 \leq T2 \leq 0.9 \times \frac{W}{S} \times T1$$

10. The image capturing apparatus of claim 8, wherein the image capturing apparatus satisfies:

$$0.9 \times \frac{W}{S} \times T1 \le T2 \le T1.$$

11. The image capturing apparatus of claim 8, further comprising:
   a light source; and
   a bandpass filter layer, disposed between the organic light emitting diode display panel and the sensor, wherein a light spectrum of the light source falls within a transmission spectrum of the bandpass filter layer.

12. The image capturing apparatus of claim 1, wherein a distance between the plurality of light passing openings is S, a width of each of the plurality of light passing openings is W, W<S, a transparent substrate thickness of a first collimating device of the plurality of collimating devices is T1, a transparent substrate thickness of a second collimating device of the plurality of collimating devices is T2, and the image capturing apparatus satisfies:

$$0.3 \times \frac{W}{S} \times T1 \le T2 \le T1.$$

13. The image capturing apparatus of claim 12, wherein the image capturing apparatus satisfies:

$$0.3 \times \frac{W}{S} \times T1 \le T2 \le 0.9 \times \frac{W}{S} \times T1.$$

14. The image capturing apparatus of claim 12, wherein the image capturing apparatus satisfies:

$$0.9 \times \frac{W}{S} \times T1 \le T2 \le T1.$$

15. The image capturing apparatus of claim 14, further comprising:
   a light source; and
   a bandpass filter layer, disposed between the organic light emitting diode display panel and the sensor, wherein a light spectrum of the light source falls within a transmission spectrum of the bandpass filter layer.

16. The image capturing apparatus of claim 12, further comprising:
   a light source; and
   a bandpass filter layer, disposed between the organic light emitting diode display panel and the sensor, wherein a light spectrum of the light source falls within a transmission spectrum of the bandpass filter layer.

17. The image capturing apparatus of claim 1, further comprising:
   a light source; and
   a bandpass filter layer, disposed between the organic light emitting diode display panel and the sensor, wherein a light spectrum of the light source falls within a transmission spectrum of the bandpass filter layer.

18. The image capturing apparatus of claim 1, wherein the organic light emitting diode display panel comprises a plurality of drill holes respectively penetrating the cover plate, the passivation layer, the display device array layer, the planarization layer, the active device array layer, and the reflective layer to expose the plurality of sensing areas of the sensor.

\* \* \* \* \*